United States Patent [19]
Hwang et al.

[11] Patent Number: 4,833,516
[45] Date of Patent: May 23, 1989

[54] HIGH DENSITY MEMORY CELL STRUCTURE HAVING A VERTICAL TRENCH TRANSISTOR SELF-ALIGNED WITH A VERTICAL TRENCH CAPACITOR AND FABRICATION METHODS THEREFOR

[75] Inventors: Wei Hwang, Armonk; Nicky C. Lu, Yorktown Heights, both of N.Y.

[73] Assignee: International Business Machines Corporation, Armonk, N.Y.

[21] Appl. No.: 81,270

[22] Filed: Aug. 3, 1987

[51] Int. Cl.$^4$ .................... H01L 29/78; H01L 29/04; H01L 29/06

[52] U.S. Cl. ................................ 357/23.6; 357/23.12; 357/60; 357/55

[58] Field of Search ..................... 357/23.6, 23.12, 60, 357/55; 437/52

[56] References Cited

U.S. PATENT DOCUMENTS

| | | | |
|---|---|---|---|
| 3,883,948 | 5/1975 | Allison | 357/50 |
| 4,635,090 | 1/1987 | Tamaki et al. | 357/55 |
| 4,645,564 | 2/1987 | Morie et al. | 357/23.6 |
| 4,649,625 | 3/1987 | Lu | 357/51 |

FOREIGN PATENT DOCUMENTS

| | | | |
|---|---|---|---|
| 108390 | 5/1984 | European Pat. Off. | 357/23.6 |
| 187237 | 7/1986 | European Pat. Off. | 357/23.6 |
| 58-3269 | 1/1983 | Japan . | |
| 59-19366 | 1/1984 | Japan . | |

OTHER PUBLICATIONS

IBM Technical Disclosure Bulletin, vol. 27, No. 12, May 1985, pp. 7051–7052, "Dynamic Ram Cell Structure".
IBM Technical Disclosure Bulletin, vol. 29, No. 5, Oct. 1986, "High Density Vertical Dram Cell", pp. 2335–2340.
IBM Technical Disclosure Bulletin, vol. 27, No. 11, Apr. 1985, "Dynamic Ram Cell with Merged Drain and Storage", pp. 6694–6699.

*Primary Examiner*—Andrew J. James
*Assistant Examiner*—Robert P. Limanek
*Attorney, Agent, or Firm*—John J. Goodwin

[57] ABSTRACT

A new high density vertical trench transistor and trench capacitor DRAM (dynamic-random-access memory) cell is described incorporating a wafer with a semiconductor substrate and an epitaxial layer thereon including a vertical transistor disposed in a shallow trench stacked above and self-aligned with a capacitor in a deep trench. The stacked vertical transistor 14 has a channel partly on the horizontal surface and partly along the shallow trench sidewalls. The drain of the access transistor is a lightly-doped drain structure connected to a bitline element. The source of the transistor, located at the bottom of the transistor trench and on top of the center of the trench capacitor, is self-aligned and connected to polysilicon contained inside the trench capacitor. Three sidewalls of the access transistor are surrounded by thick oxide isolation and the remaining one side is connected to drain and bitline contacts. The memory cell is located inside an n-well and uses the n-well and heavily-doped substrate as the capacitor counter-electrode plate. The cell storage node is the polysilicon inside the trench capacitor and include steps for growing epitaxial layers wherein an opening is left which serves as the shallow trench access transistor region and provides self-alignment with the deep trench storage capacitor.

4 Claims, 6 Drawing Sheets

HIGH DENSITY MEMORY CELL STRUCTURE HAVING A VERTICAL TRENCH TRANSISTOR SELF-ALIGNED WITH A VERTICAL TRENCH CAPACITOR AND FABRICATION METHODS THEREFOR

BACKGROUND OF THE INVENTION

1. Field of the Invention

The present invention relates to dynamic-random-access memory cell structures, including particularly to a memory cell structure, and shallow trench access transistor disposed vertically above and self-aligned to an underlying deep trench storage capacitor structure and fabrication processes therefor.

2. Background Art

The following references are representative of the background art available prior to the present invention.

Japanese Pat. No. 59-19366 describes a vertical FET semiconductor memory device disposed between condensers for storing charge. Electrostatic capacity from the device substrate is utilized for storing the memory charge.

Japanese Pat. No. 56-100523 relates to a vertical one-transistor MOS memory cell having a cylindrical gate electrode, an insulating layer and source and drain layers. The source of drain layer can also be one electrode of a charge storage capacitor.

The publication entitled DYNAMIC RAM CELL STRUCTURE, IBM, IBM Technical Disclosure Bulletin, Vol 27, No. 12, May 1985 at page 7051 relates generally to integrated circuit structures and more particularly to dynamic-random-access memory (DRAM) cell construction having a stacked planar MOS access transistor over a buried pn junction storage capacitor.

The publication entitled HIGH DENSITY VERTICAL DRAM CELL, IBM Technical Disclosure Bulletin, Vol. 29, No. 5, October 1986 at page 2335, describes a high density vertical trench DRAM (dynamic-random-access memory) cell wherein the transfer device is oriented in the vertical direction and is positioned over a trench storage capacitor. A shallow trench filled with polysilicon or polycide serves as the MOS transfer device gate. Transfer MOSFETs of adjacent cells share the same gate.

The publication entitled DYNAMIC RAM CELL WITH MERGED DRAIN AND STORAGE, IBM Technical Disclosure Bulletin, Vol. 27, No. 11, April 1985 at page 6694 relates generally to the fabrication of integrated circuits and more particularly to the construction of a dynamic-random-access memory cell requiring less space.

SUMMARY OF THE INVENTION

An object of the present invention is to provide an improved high density dynamic random-access memory cell structure.

Another object of the present invention is to provide an improved memory cell structure including a vertical trench transistor and trench capacitor.

Still another object of the present invention is to provide an improved high density Y-cell memory structure including a Y-groove shallow trench access transistor disposed vertically over and self-aligned with a deep trench storage capacitor.

A further object of the present invention is to provide an improved method including a self-alignment epitaxial growth process for fabricating a high density dynamic-random-access memory cell structure.

DISCLOSURE OF THE INVENTION

A new high density vertical trench transistor and trench capacitor DRAM (dynamic-random-access memory) cell is described.

Figure 1:
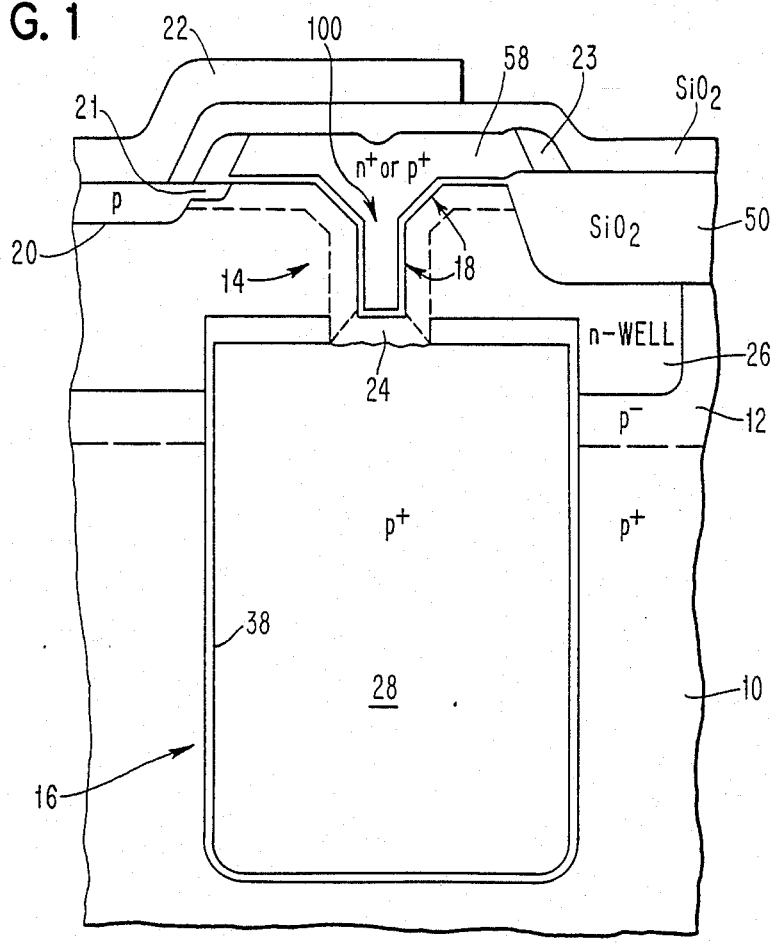
FIG. 1 is a schematic cross-sectional illustration of a memory cell including a vertical access transistor self-aligned with a storage capacitor according to the principles of the present invention.
Figure 2:
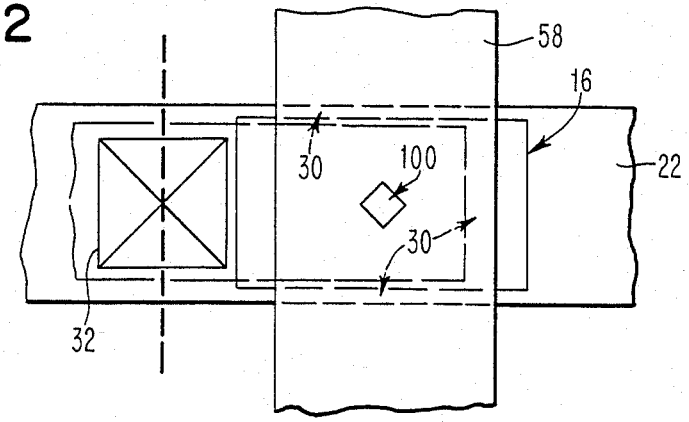
FIG. 2 is a schematic plan view illustration of the layout of the memory cell of FIG. 1.

An embodiment of the invention is illustrated in the cross-sectional view of FIG. 1 and the plan view of FIG. 2. In FIG. 1, a wafer with a semiconductor substrate 10 and an epitaxial layer 12 thereon is shown including a vertical transistor 14 disposed in a shallow trench 100 stacked above and self-aligned with a capacitor in a deep trench 16.

The stacked vertical transistor 14 has a channel 18 partly on the horizontal surface and partly along the shallow trench sidewalls. The drains 20 and 21 of the access transistor can be a lightly-doped diffused drain structure and is connected to a bitline element 22. The source 24 of the transistor 14, located at the bottom of the transistor trench and on top of the center of the trench capacitor, is connected in self-alignment to the polysilicon 28 inside the trench capacitor. By looking at the top view (FIG. 2) of the access transistor gate, its three sides are overlayed on top of thick oxide isolation 30 and the only one side is bounded by the drain diffusion area which is connected to the bitline 22 through the contact 32. The cell is located inside an n-well and uses the n-well 26, the epitaxial layer 12 and heavily-doped p+ substrate 10 as the capacitor counter-electrode plate. The cell storage node is the p+ polysilicon 28 inside the trench capacitor.

The structure shown in FIGS. 1 and 2 will be more clearly understood by a description of the fabrication process. The fabrication procedures of the memory cell are described in the following steps:

Step (1) Start with a <100> silicon wafer with p-epitaxial layer 12 on p+ substrate 10. Grow pad oxide (SiO$_2$) layer 34 and deposit pad nitride (Si$_3$N$_4$) layer 36. After suitable lithography and etching steps, an opening is made in the composite layers 36 and 34 for the storage capacitor region.

Step (2) With the pad nitride 36 as a mask, etch a relatively deep trench 16 through the epitaxial layer 12 into the heavily doped substrate 10 by reactive-ion-etching (RIE). Form a thin oxide/nitride/oxide composite layer 38 on the deep trench sidewalls for the storage-capacitor thin insulator.

Figure 3:
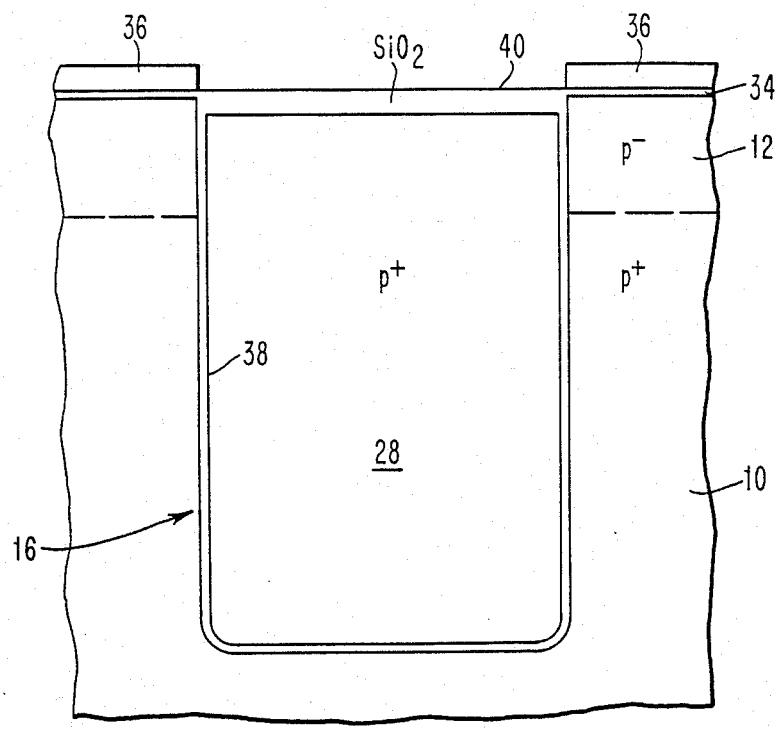
FIGS. 3, 4, 5, 6, 7, 8 and 9 show schematic cross-sectional views illustrating various stages in the fabrication of the memory cell structure of FIGS. 1 and 2 employing a method according to the principles of the present invention.

Step (3) Fill the deep trench 16 with chemical-vapor-deposition (CVD) p+ polysilicon 28. Remove the excess polysilicon above the deep trench by using suitable planarization techniques such as RIE or chemical-mechanical polishing. Then grow an oxide layer 40 with suitable thickness over the trench capacitor. Because most of the silicon surface, except trench-capacitor regions, is covered by the nitride layer 36, the oxide 40 is locally grown only on top of the deep trench area. The resultant structure through steps 1, 2 and 3 is shown in FIG. 3.

Figure 4:
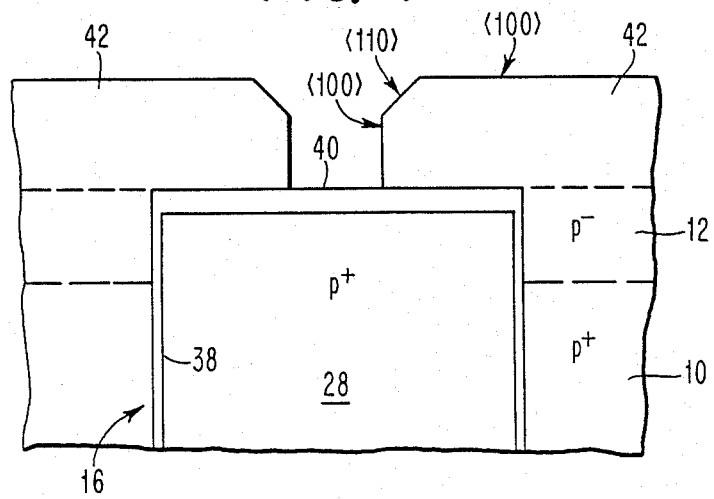

Step (4) Remove the pad nitride 36 and pad oxide 34. A certain thickness $SiO_2$ layer 40 remains on polysilicon 28 by virtue of its much greater thickness compared to the pad oxide 34. Then grow a second epitaxial layer 42 of suitable thickness. Due to the crystalline seeds from the exposed single crystal region surrounding the trench capacitor which is covered by oxide 40, an epitaxial layer 42 can be overgrown laterally on top of the deep trench capacitor. By adjusting the epitaxial growth rate to make a desired vertical epitaxial layer 42 thickness, a suitable lateral epitaxial thickness can be achieved, which leaves an opening at the center of the top surface of the deep trench capacitor 16 (FIG. 4). The epitaxial layer thickness can be affected by using differnt deep trench capacitor shapes with different length-to-width aspect ratios. Experimental results show that for a given epitaxial layer 42 thickness, different length-to-width aspect ratios of the deep trenches result in different opening sizes. For example, for deep trenches having the same width but different lengths, the opening sizes are different. In order to achieve the same opening sizes, the longer trenches require thicker epitaxial films. Therefore, for a specific opening size, trenches with different aspect ratios require different epitaxial thicknesses, which is a parameter used for designing the vertical transistor channel length. Experimental results also show that the lateral epitaxial growth gives a flat $<100>$ surface, tilted $<110>$ surfaces and vertical $<100>$ planes as shown in FIG. 4. The opening left in the second epitaxial layer 42 over the deep trench is referred to as a shallow trench for the vertical transistor and defines an access transistor device region.

In the following, two alternative processing methods can be used. The first alternative, which will be described in the steps from 5 to 11, is to form the channel and source regions of the transistor before fabricating the isolation and n-well. The second alternative, which will be described in the steps from 12 to 16, is to remove the exposed oxide layer on top of the trench capacitor after the isolation and n-well have been formed. As a result, the lateral diffusion of dopants from the p+ polysilicon storage node in the trench capacitor can be less than that in the first alternative.

Figure 5:
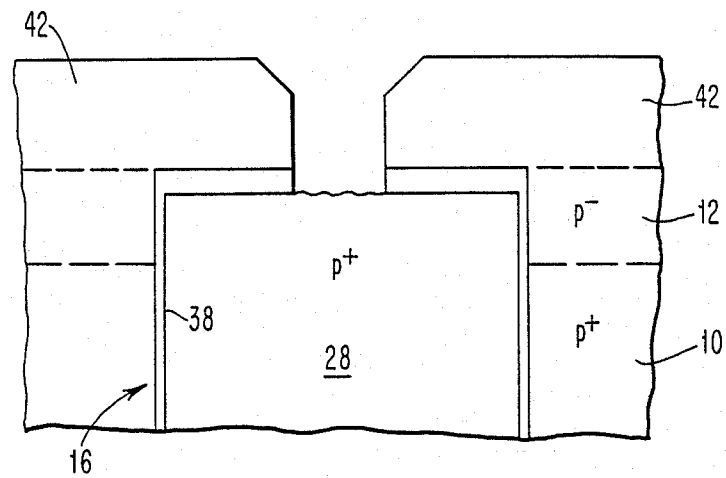

Step (5) Use the epitaxial layer 42 as a self-alignment mask for removing $SiO_2$ layer over polysilicon 28 in window area by either wet chemical, dry plasma or reactive ion etching, as shown in FIG. 5. Thus, a contact region to the trench filled polysilicon 28 has been established by a self-aligned epitaxial growth technique rather than by lithographic masking steps which can cause misalignment errors.

Figure 6:
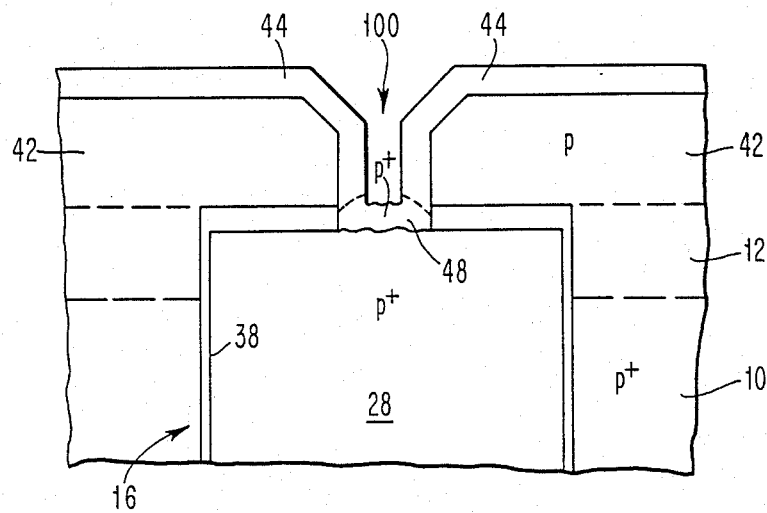

Step (6) Regrow a third thin p-type epitaxial layer 44 and leave an opening 100 on top of the deep trench 16 surface as shown in FIG. 6. Since the polysilicon 28 inside the trench is exposed to the third epitaxial growth of the layer 44, a low-quality p+ epitaxial region 48, called "neck", is formed vertically. The third epitaxial layer 44 thickness is controlled so that the "neck" 48 is growing just above the deep trench capacitor oxide surface as shown in FIG. 6.

Figure 7:
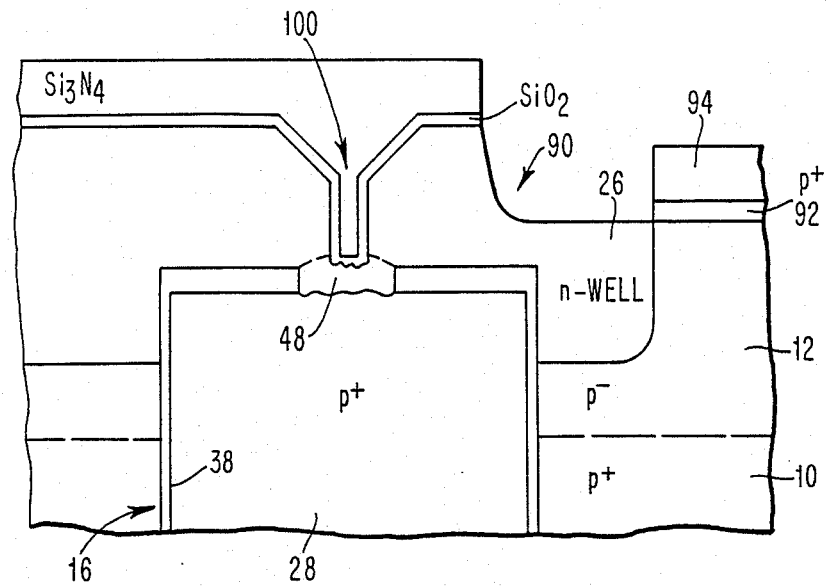
Figure 8:
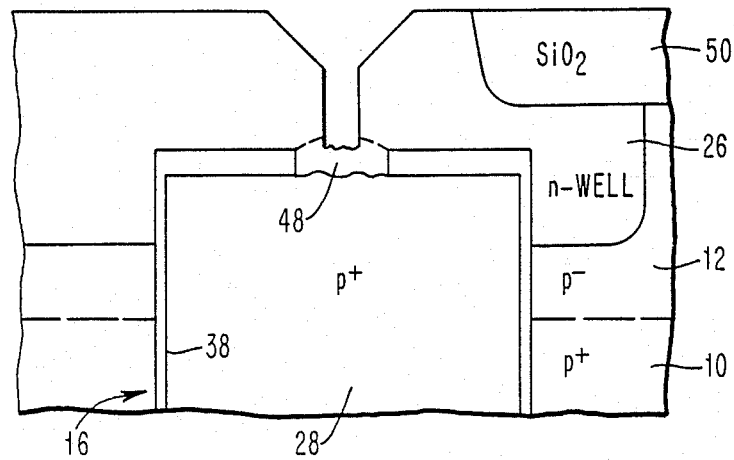

Step (7) Isolation regions and the n-well regions are then fabricated in the conventional manner, which is briefly described in FIG. 7. A composite layer of $SiO_2$ and $Si_3N_4$ is formed on the substrate and fills the shallow trench region 100. After suitable lithography steps, an opening is made in the composite layer. The composite layer which remains is then used to mask the etch of a shallow trench 90 by RIE (reactive ion etching) as shown in FIG. 7. A thin p+ doped glass film 92 is deposited for preparing field isolation of peripheral n-channel devices. A photoresist layer is applied and a mask is used to remove part of the photoresist and the underlying p+ glass layer to expose the regions for n-well formation. Then n-type dopants are implanted through the composite layer of $SiO_2$ and $Si_3N_4$ to form n-well 26 regions. Photoresist 94 outside the n-well region blocks the n-type implantation into the n-channel device regions. After the photoresist is removed, a short thermal cycle is used to drive in the p-type dopant from the glass layer into the substrate 12 and then the p+ glass layer is removed. A thin thermal oxide is grown over the shallow trench 90 surface, followed by depositing a thick oxide layer to fill the shallow trench. Use either RIE or chemical-mechanical polishing planarization technique to result in a coplanar surface between the oxide isolation 50 and substrate surface (FIG. 8). Then the composite layer of $SiO_2$ and $Si_3N_4$ is removed. As a result, an oxide isolation region 50 and n-well region 26 are formed so that the access device can be isolated and located within the n-well as shown in FIG. 8.

Step (8) Grow a thin gate-oxide layer 18. Because of the high diffusivity of the p+ neck epitaxial region 48, the buried source region (24 in FIG. 1) of the access transistor can be formed from region 48. This novel p+ connection between the buried source region (24 of FIG. 1) of the transistor and the polysilicon inside the storage trench capacitor is formed in a self-alignment scheme.

Figure 9:
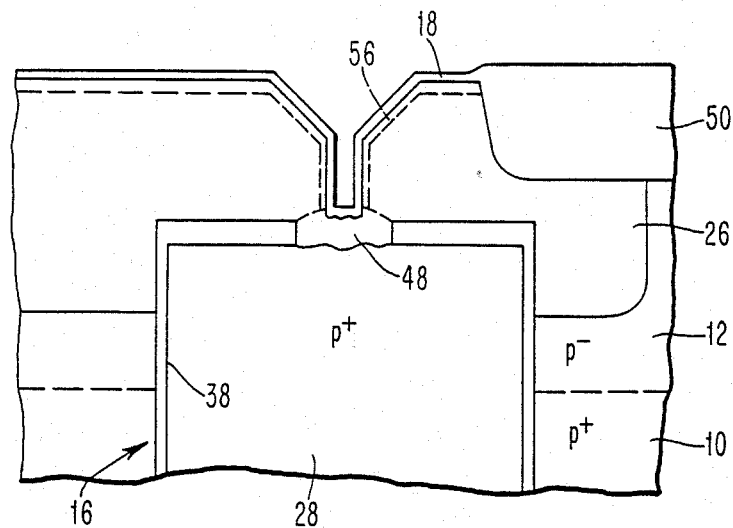

Step (9) A PMOS threshold-voltage adjustment is made by implanting a shallow boron profile 56 underneath the gate oxide 18. Because of the wafer $<100>$ flat surface and the titled surface of $<110>$ plane as shown in FIG. 9, the channel implant can be shallow at the $<100>$ and $<110>$ channel surfaces. This step is not mandatory, but depends on the actual device design needs.

Step (10) Fill the trench opening with CVD n+ or p+ polysilicon (58 in FIG. 1) or any other suitable conductive material which is patterned as the transfer gate and the wordline. Implant lightly doped drain region (21 in FIG. 1) for the transistor. After the oxide spacer 23 is formed around the gate edges, the heavily doped p+ drain region 20 can be formed by either boron implantation or diffusion from a polysilicon or a polycide bitline 22, which is connected to the drain region.

Step (11) Then the standard CMOS processes are followed to complete the cell structure. The final cross section of the memory cell structure is shown in FIG. 1.

The following is the second processing alternative that allows the exposed oxide region on top of the trench capacitor to be removed after the isolation and n-well are completed so that the lateral diffusion of dopants from the polysilicon storage node can be reduced.

Figure 10:
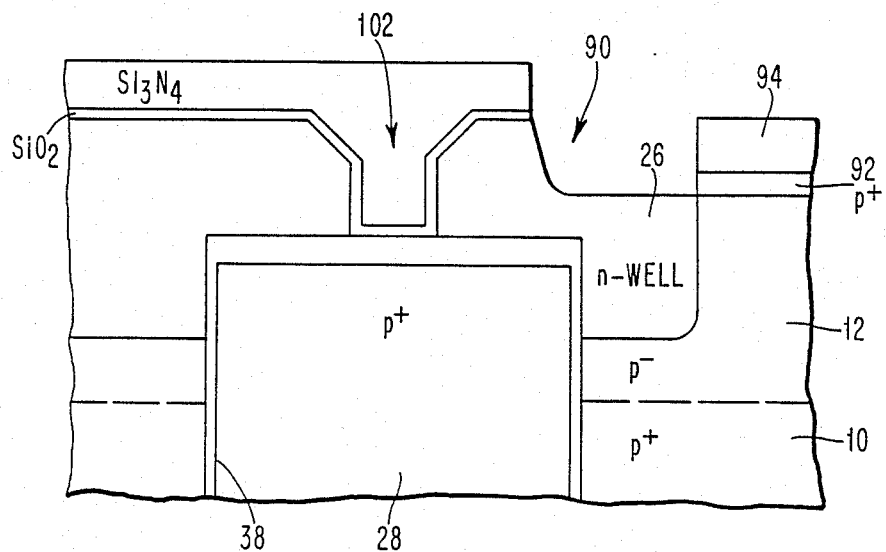
FIGS. 10 and 11 show schematic cross-sectional views illustrating various stages in the fabrication of the memory cell structure of FIG. 12 employing an alternative method also according to the principles of the present invention.

Step (12) After the processing step 4, grow the pad oxide, deposit the pad nitride, and pattern the shallow trench isolation 90 regions where both the pad oxide and the pad nitride are removed (FIG. 10). Use RIE to make shallow trenches 90 into silicon. The thicknesses of the pad nitride and the pad oxide are adjusted such that the pad nitride can be completely filled into the shallow transistor trench 102 with an almost flat surface. Thus, after the oxide for the shallow trench isolation is planarized, which will be described in the step 13, there is no residue oxide left over the top of the nitride layer filled inside the transistor shallow trench region 102. Then a boron-rich glass layer and a photoresist layer 94 are deposited. An n-well mask is used to define the regions where the n-well can be formed by an n-type dopant implantation. The n-well implantation is made through the pad nitride and the pad oxide layers but blocked in the regions outside the n-well by the photoresist layer 94. The boron-rich glass provides the p-type dopants needed for the field isolation in N-channel MOS devices (FIG. 10).

Step (13) After the photoresist is removed, a short thermal cycle is used to drive in the p-type dopants into the substrate 12, and the boron glass layer is removed. Then a thin layer of thermal oxide is grown on the sidewalls of shallow trenches 90 and then the thick CVD oxide is deposited to fill completely the isolation regions. Either RIE or chemical-mechanical polishing technique is used to planarize the oxide within the shallow trench 90 areas to result in a coplanar surface between the oxide isolation and the wafer surface. Then both the pad nitride and the pad oxide are removed.

Figure 11:
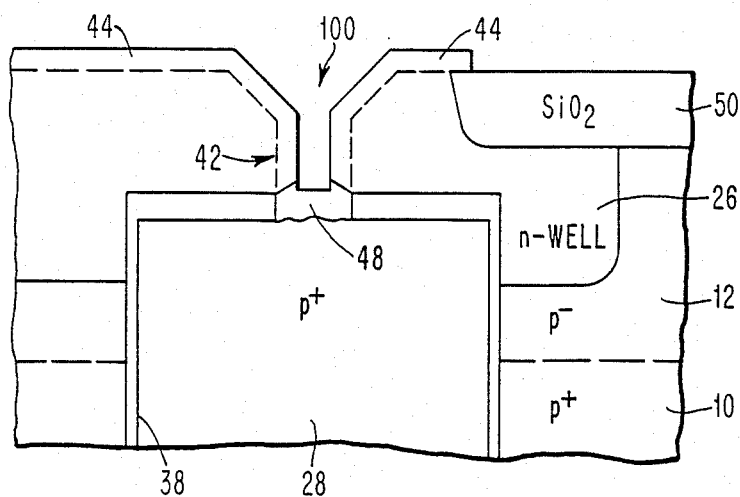

Step (14) Use epitaxial layer 42 as a self-aligned mask to remove oxide layer over polysilicon 28 in window area by either wet chemical, dry plasma or RIE etching. Then regrow the third undoped epitaxial layer 44, and the thickness of the epitaxial layer is adjusted to leave an opening 100 on top of the trench surface as shown in FIG. 11. On the other hand, this third epitaxial layer is thin enough that it can have similar doping type and level as the second epitaxial layer 42 because of dopants redistribution through the subsequent thermal cycles.

Figure 12:
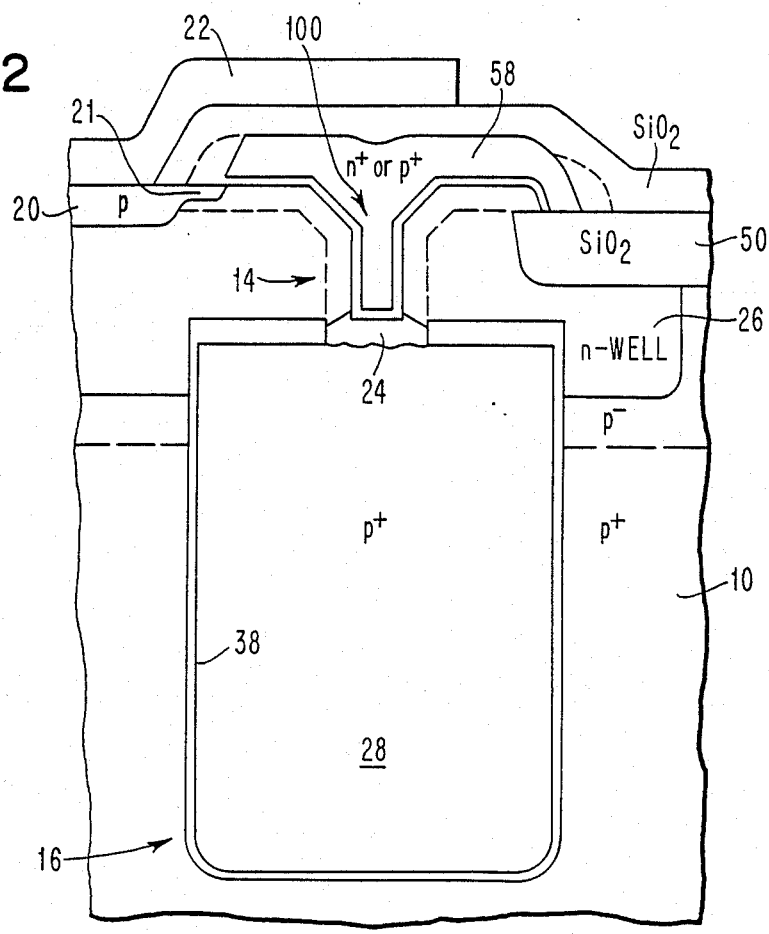

Step (15) Follow similar processing steps as illustrated in the steps 9 and 10. Then a layer of CVD oxide (FIG. 12) is deposited, which isolates the third epitaxial layer 44 and passivates its surface. Then the standard CMOS processes are followed to complete the cell structure, as shown in FIG. 12. This structure is slightly different from the structure shown in FIG. 1 in that the epitaxial layer 44 is on top of the shallow trench isolation 50, because the layer 44 is grown after the oxide isolation has been formed.

The described memory cell structure incorporates the following important new features.

The transistor is built on a small opening trench formed by lateral epitaxial growth. The Y-shape trench transistor is self-aligned to the opening at the center of the trench storage capacitor, resulting in the cell size insensitive to lithography overlay inaccuracies.

The Y-transistor channels consists of three parts: flat surface $<100>$ part, tilted $<110>$ part, and vertical $<100>$ part surrounding the transistor trench sidewalls. This is different from the prior art trench transistors which have just vertical trench sidewalls for channels and are difficult to have shallow threshold implants. Also, in the new cell structure, the crystal orientations in the channel region are well defined from crystal growth nature, resulting in more uniform device characteristics. In addition, the area of the vertical part of the trench transistor region is controlled by the epitaxial thickness which is determined by the uniformity of the epitaxial growth rate rather than the lithography minimum feature. As a result, the trench opening of the vertical transistor can be made very small such that the wordline loading can be smaller compared to the prior art cells.

The special cell layout depicted in FIG. 2 is unique. The wordline is laid over the thick oxide on three sides of the transistor, which can reduce the wordline capacitance. This is different from the conventional planar cell layout where wordline is laid over either thick oxide only on two sides or over the storage capacitor plate. Also, this vertical cell can use metal or polycide bitline layout instead of diffusion bitlines. Therefore, the wordline-to-bitline coupling capacitance is significantly reduced in this cell layout technique.

The memory cell can be made n-channel without loss of generality by reversing the dopant polarity of polysilicon trench fill 28, forming an p-type "well" region in epitaxial layer 12 and forming n-channel vertical FET devices in the p-type well.

The memory cell can be made n-channel outside the n-well region without loss of generality by reversing the dopant polarity of polysilicon trench fill 28 and forming n-channel vertical FET as transfer devices.

Having thus described our invention, what we claim as new, and desire to secure by Letters Patent is:

1. A semiconductor vertical access transistor/storage capacitor memory cell structure comprising
    a semiconductor substrate,
    a layer of epitaxial semiconductor material disposed on said substrate,
    a deep trench storage capacitor structure located in said epitaxial layer and substrate, said deep trench including an insulation layer on the walls thereof, and a filling of polysilicon material to form a storage capacitor,
    a shallow Y-shaped trench access transistor located over said deep trench in said epitaxial layer said deep trench having sidewalls containing an insulation layer, and being filled with polysilicon material.
    said Y-shaped shallow trench being characterized in having a horizontal floor spaced above the top surface of said polysilicon filled deep trench, vertical sidewalls extending up from said horizontal floor and tilted sidewalls extending above the tops of said vertical sidewalls, said vertical and tilted sidewalls having lateral widths substantially smaller than the lateral width between said walls of said deep trench,
    a source region disposed between said shallow polysilicon filled trench and said deep polysilicon filled trench,
    said source region composed of a neck structure of epitaxial polysilicon material extending from said top surface of said polysilicon filled deep trench to said horizontal floor of said Y-shaped shallow trench disposed thereover,
    said source region having a total lateral width substantially smaller than the lateral width of the top surface of said deep trench, and
    drain regions disposed in said epitaxial layer.

2. A semiconductor vertical access transistor/storage capacitor memory cell structure according to claim 1 wherein said substrate is composed of p+ type semiconductor material, said epitaxial layer is composed of p− type semiconductor material, said deep trench is filled with p+ type polysilicon, and said Y-shaped shallow trench is filled with n+ type semiconductor material.

3. A semiconductor vertical access transistor/storage capacitor memory cell structure according to claim 1 wherein said substrate is composed of p+ type semiconductor material, said epitaxial layer is composed of p− type semiconductor material, said deep trench is filled with p+ type polysilcon, and said Y-shaped shallow trench is filled with p+ type semiconductor material.

4. A semiconductor vertical access transistor/storage capacitor memory cell structure according to claim 1 wherein said substrate is <100> silicon, said horizontal and vertical sidewalls of said Y-shaped shallow trench are <100> silicon, and said tilted sidewalls are <110> silicon.

* * * * *